(12) United States Patent
Stella et al.

(10) Patent No.: US 10,823,622 B2
(45) Date of Patent: Nov. 3, 2020

(54) TEMPERATURE MEASUREMENT IN SWITCHGEAR STATIONS

(71) Applicant: General Electric Technology GmbH, Baden (CH)

(72) Inventors: Eros Stella, Roncade (IT); Jean-Luc Rayon, Montanay (FR); Vincenzo Girlando, Padua (IT)

(73) Assignee: General Electric Technology GmbH, Baden (CH)

( * ) Notice: Subject to any disclaimer, the term of this patent is extended or adjusted under 35 U.S.C. 154(b) by 58 days.

(21) Appl. No.: 15/533,847

(22) PCT Filed: Dec. 9, 2014

(86) PCT No.: PCT/EP2014/077053
§ 371 (c)(1),
(2) Date: Jun. 7, 2017

(87) PCT Pub. No.: WO2016/091289
PCT Pub. Date: Jun. 16, 2016

(65) Prior Publication Data
US 2017/0336266 A1    Nov. 23, 2017

(51) Int. Cl.
*G01K 13/00* (2006.01)
*G01K 7/32* (2006.01)
(Continued)

(52) U.S. Cl.
CPC .............. *G01K 7/32* (2013.01); *G01K 1/024* (2013.01); *G01K 11/265* (2013.01); *G01K 13/00* (2013.01);
(Continued)

(58) Field of Classification Search
CPC ........ G01K 7/32; G01K 1/024; G01K 11/265; G01K 13/00; H01Q 1/38; H02B 13/065; H03H 9/02535
See application file for complete search history.

(56) References Cited

U.S. PATENT DOCUMENTS 4,658,322 A * 4/1987 Rivera ................. H02H 1/0023
340/626
6,195,253 B1 * 2/2001 Fahlgren .................. H02B 5/00
200/48 A
(Continued)

FOREIGN PATENT DOCUMENTS

CN    203231829 U    10/2013
CN    103983371 A    8/2014
(Continued)

OTHER PUBLICATIONS

International Search Report issued in Application No. PCT/EP2014/077053 dated Aug. 20, 2015.
(Continued)

*Primary Examiner* — Eman A Alkafawi
*Assistant Examiner* — Lynda Dinh
(74) *Attorney, Agent, or Firm* — Eversheds Sutherland (US) LLP

(57) ABSTRACT

The invention relates to a device for measuring temperature in a high-voltage portion of a switchgear station, characterised in that it comprises: at least one temperature sensor (21, 22, 23, 24) located at a point on the high-voltage portion of which the temperature is to be monitored, at least one antenna (25) connected to the at least one temperature sensor, a control module (26) located in a low-voltage portion of the switchgear station, and at least one antenna (27) connected to the control module. The at least one temperature sensor (21, 22, 23, 24) is suitable for transmitting a signal representative of a temperature measurement (Continued)

and the control module (26) is suitable for receiving the representative signal, via the antennas, and for processing said signal in order to produce a message.

6 Claims, 2 Drawing Sheets

(51) Int. Cl.
 *H01Q 1/38* (2006.01)
 *H02B 13/065* (2006.01)
 *G01K 11/26* (2006.01)
 *G01K 1/02* (2006.01)
 *H03H 9/02* (2006.01)

(52) U.S. Cl.
 CPC ............. *H01Q 1/38* (2013.01); *H02B 13/065* (2013.01); *H03H 9/02535* (2013.01)

(56) References Cited

U.S. PATENT DOCUMENTS

| | | | |
|---|---|---|---|
| 2006/0119344 A1* | 6/2006 | Benke | G01D 21/00 324/126 |
| 2012/0143559 A1 | 6/2012 | Wall | |
| 2013/0182355 A1* | 7/2013 | Coca Figuerola | H01F 27/402 361/35 |
| 2014/0240184 A1* | 8/2014 | Andle | G01R 29/0871 343/720 |
| 2014/0300486 A1* | 10/2014 | Hummel | G01R 15/142 340/870.01 |

FOREIGN PATENT DOCUMENTS

| | | |
|---|---|---|
| DE | 10 2011 079 935 A1 | 1/2013 |
| DE | 10 2011 079935 A1 | 1/2013 |
| EP | 2 283 553 | 2/2011 |
| EP | 2 283 553 A1 | 2/2011 |
| EP | 2 287 584 A1 | 2/2011 |
| WO | 2009/138506 A1 | 11/2009 |

OTHER PUBLICATIONS

Written Opinion issued in Application No. PCT/EP2014/077053 dated Aug. 20, 2015.
Office Action issued in connection with corresponding EP Application No. 14812194.0 dated Jul. 18, 2018 (English Translation Unavailable) (6 pp.).
Examination Report No. 1 issued in connection with corresponding Australian Patent Application 2014413585 dated Apr. 30, 2020.
Preliminary Examination Report issued in connection with corresponding Brazilian Patent Application BR112017011707-0 dated Apr. 14, 2020.
First Office Action issued in connection with corresponding Chinese Patent Application 201480083886.9 dated Jan. 18, 2019.
Second Office Action issued in connection with corresponding Chinese Patent Application 201480083886.9 dated Sep. 3, 2019.
Decision of Rejection issued in connection with corresponding Chinese Patent Application 201480083886.9 dated Mar. 27, 2020.
Ming Pang, Li Liu, et. al. "IOT Barcode Technology and Radio Frequency Identification Technology." China Materials Press, p. 357, May 2011 (English Translation Unavailable).
Wu Liyuan, et al. "Practicality of Surface Acoustic Wave Sensors in Online Temperature Measurement of Distribution Network Equipment." Electrical Applications, pp. 694-697, Dec. 2013 (English Translation Unavailable).
Li Yongteng, et al. "Development of High Voltage Switchgear Monitoring System." Journal of Shanghai University of Electric Power, vol. 29, No. 5, pp. 433-436, Oct. 2013 (English Translation Unavailable).
Decision of Rejection issued in connection with Corresponding European Patent Application 14812194.0 dated Mar. 5, 2020 (English Translation Unavailable).
First Office Action issued in connection with corresponding Mexican Patent Application MX/a/2017/007240 dated Sep. 27, 2019.
Second Office Action issued in connection with corresponding Mexican Patent Application MX/a/2017/007240 dated Feb. 20, 2020 (English Translation Unavailable).

* cited by examiner

TEMPERATURE MEASUREMENT IN SWITCHGEAR STATIONS

This application is the national stage of PCT/EP2014/077053 filed on Dec. 9, 2014.

TECHNICAL FIELD

This invention relates to temperature measurement in high-voltage switchgear stations, of the AIS (Air Insulated Substation) or GIS (Gas Insulated Substation) type. It also relates to such a switchgear station equipped with temperature measurement means.

PRIOR ART

A switchgear station is comprised of a set of electrical equipment, such as circuit breakers, current and voltage transformers, disconnectors and mechanical structures necessary for supporting the electrical equipment.

Maximum temperatures are defined by IEC or IEEE international standards. The electrical currents, which may be on the order of several thousand amperes, as well as the environmental conditions (temperature, wind . . . ) have an influence on the temperature of the electrical equipments. This leads to the definition of nominal use ranges and possible overloads.

However, over the lifetime of a switchgear station, an equipment may be disassembled and then reassembled, and equipments may be added. If an disconnector is rarely used, for example once or twice per year, its contacts may become oxidized. Thus, contact resistance modifications may occur. Even if these modifications are mild overall and appear to be negligible, they may actually generate hot spots due to high currents that exist at said switchgear stations.

The existence of these hot spots determines the admissible overload of the equipment concerned. It is therefore important to measure their temperature.

For this, contactless temperature measurement devices exist, for example, portable thermography devices. They make it possible to perform measurements during maintenance projects, for example performed periodically. These measurements are not performed in real time during operation of the switchgear station. Moreover, there can be difficulties reaching certain points due to the presence of obstacles, for example, an anti-corona ring.

There are also "on-board" temperature measurement devices at a switchgear station. These known devices require an electrical power supply, for example by battery. Regular maintenance of these devices is required, consequently involving a power interruption at the switchgear station.

Document WO 2009/138506 proposes the use of surface acoustic wave temperature sensors.

DESCRIPTION OF THE INVENTION

The invention is intended to solve the problems of the prior art by providing a temperature measurement device in a high-voltage portion of a switchgear station, characterized in that it comprises:

at least one temperature sensor located at a point of the high-voltage portion, the temperature of which is to be monitored, at least one antenna connected to the at least one temperature sensor, a control module located in a low-voltage portion of the switchgear station, at least one antenna connected to the control module, the at least one temperature sensor being suitable for transmitting a signal representative of the temperature measurement and the control module being suitable for receiving the representative signal, via the antennas, and processing it in order to produce a message.

Owing to the invention the measurements are performed in real time during operation of the switchgear station.

The invention does not use a power supply battery; therefore, no maintenance is necessary.

The temperature sensors used in the context of the invention maybe installed as close as possible to the hot spots such as contacts, for example.

According to a preferred feature, the at least one temperature sensor is a passive sensor.

According to a preferred feature, the at least one temperature sensor is powered by the control module via the antennas.

The invention also relates to a switchgear station characterized in that it comprises a temperature measurement device as described above.

The invention also relates to a temperature measurement method in a high-voltage portion of a switchgear station, characterized in that it comprises steps of:

temperature measurement by at least one temperature sensor located at a point of the high-voltage portion, the temperature of which is to be monitored, transmission of a signal representative of the temperature measurement by the at least one sensor via at least one antenna connected to the at least one temperature sensor, reception of the representative signal by a control module located in a low-voltage portion of the switchgear station, via at least one antenna connected to the control module, processing of the representative signal by the control module in order to produce a message.

The switchgear station and the method have advantages similar to those presented above.

In a particular embodiment, the steps of the process according to the invention are implemented by computer program instructions.

Consequently, the invention also relates to a computer program on an information medium, said program being capable of being implemented in a computer, said program comprising instructions suitable for implementing steps of a method as described above.

This program may use any programming language, and be in the form of a source code, an object code or an intermediate code between the source code and object code, such as in a partially compiled form, or in any other desirable form.

The invention also relates to a computer-readable information medium, comprising computer program instructions suitable for implementation of the steps of the method as described above.

The information medium may be any entity or device capable of storing the program. For example, the medium may comprise storage means, such as a ROM, for example a CD ROM or a microelectronic circuit ROM, or magnetic recording means, for example a floppy disk or a hard disk.

In addition, the information medium may be a transmissible medium such as an electrical or optical signal, which may be routed via electrical or optical cable, by radio or by other means. The program according to the invention may in particular be downloaded on an Internet-type network.

Alternatively the information medium may be an integrated circuit in which the program is incorporated, the circuit being suitable for executing or for being used in the execution of the method according to the invention.

BRIEF DESCRIPTION OF THE DRAWINGS

Other features and advantages will appear in the following description of a preferred embodiment provided as a non-limiting example, described in reference to the figures, wherein.

DETAILED DESCRIPTION OF PARTICULAR EMBODIMENTS

Figure 1:
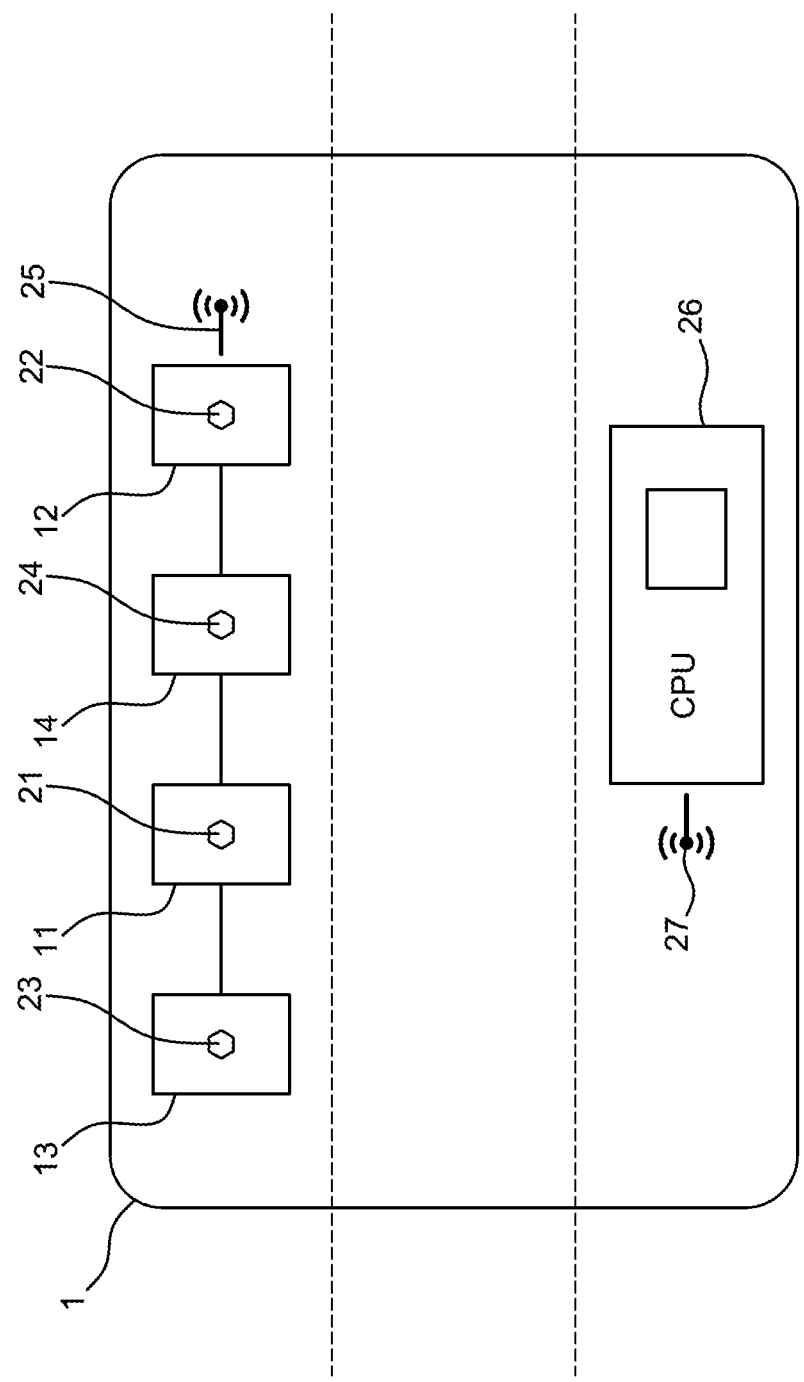
FIG. 1 shows a temperature measurement device in a switchgear station, according to an embodiment of the present invention.

According to a preferred embodiment shown in FIG. 1, a disconnector 1 equipped with a temperature measurement device is schematically shown.

The disconnector and the operation thereof are known to a person skilled in the art and are not described here. The disconnector is classically one of the elements of a switchgear station. For example, it is sought to measure the temperature of four hot spots of the disconnector 1, which are the two terminals 11 and 12, the contacts 13 and the main cutter 14.

These elements are in a high-voltage portion of the disconnector. The disconnector also comprises a low-voltage portion, separated from the high-voltage portion by air. These three portions (high-voltage, air and low-voltage) are separated schematically by dotted lines in FIG. 1.

The temperature measurement device first comprises a set of temperature sensors. The temperature sensors are arranged near hot spots of the disconnector 1 to be monitored.

According to the example of an embodiment of the invention shown in FIG. 1, the disconnector 1 is equipped with four temperature sensors. Two sensors 21 and 22 are near terminals 11 and 12 of the disconnector. One sensor 23 is near contacts 13, and a last sensor 24 is near the main cutter 14. Of course, the number of temperature sensors is adapted as needed and may be much higher. For example, several hundred temperature sensors may be provided in a switchgear station.

Sensors 21 to 24 are connected by wire to an antenna 25. The antenna 25 is preferably shielded so as to be protected from electromagnetic fields normally existing in the disconnector due to currents passing through it. Thus, there is no disturbance on the radio transmission in the range of 500 kHz to 1 MHz due to electromagnetic interference. Similarly, the various electronic circuits that process the electrical signals exchanged are placed in shielded boxes so as also to be protected from the electromagnetic fields.

An antenna may be connected to a single sensor or to a plurality of sensors, for example ten. Similarly a plurality of antennas similar to antenna 25, each connected to one or more sensors, may be provided in the high-voltage portion of the disconnector.

In the low-voltage portion of the disconnector 1, a control module 26 is connected to an antenna 27.

The temperature sensors 21 to 24 measure the temperature of the point where they are respectively placed. The quantities measured are sent by radio to the control module 26.

The sensors 21 to 24 are passive and the energy necessary for them to perform a measurement is electromagnetic energy transmitted from the control module 26 via antenna 27 and received via antenna 25. This energy is stored in adapted circuits of the sensors so as to be used by the sensors to measure the temperature and transmit a signal via antenna 25.

The module 26 processes the data that it receives to determine whether or not the temperatures in the high-voltage portion of the disconnector 1 are normal. This determination is, for example, performed by comparing the measured temperatures with nominal temperatures.

The module 26 may also take into account information provided by other sensors, for example a temperature sensor located at the module 26 itself, or a temperature sensor located outside the disconnector 1. The module 26 may also take into account other characteristics of the disconnector 1, for example its time constant, an overload margin, or maintenance constraints.

It is thus possible to define and monitor overload parameters of the disconnector. For example, at each measurement time, and for each measurement point, it is possible to determine the difference $\Delta T$ between the measured temperature and a limit temperature.

It is also possible to take into account the time constant $\tau$ of the disconnector. Thus, the maximum current $I_{max}$ that may be tolerated by the disconnector is given by the formula:

$$I_{max} = K \cdot e^{-t/\tau}$$

where K is a constant.

This formula makes it possible to verify the time constant $\tau$ in order either to correct the formula above if there are slight variations in the time constant, or to generate an alert if the value of the time constant varies significantly.

On the basis of the result of the processing performed by the module 26 on the temperatures measured, the module 26 produces a message intended for supervision of the disconnector 1 or more generally the switchgear station.

The message may take different forms and contain more or less information. For example, it is a visual or sound alarm if the temperature is too high. This alarm may also include information on an estimated admissible overload period.

The message may also be information indicating that the disconnector requires maintenance, for example if the temperatures measured are high while the currents are normal.

Figure 2:
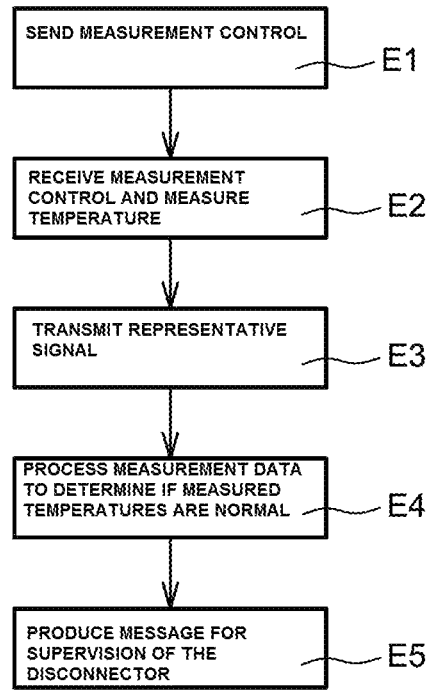
FIG. 2 shows a method for temperature measurement in a switchgear station, according to an embodiment of the present invention.

FIG. 2 shows a temperature measurement method implemented by the device described above. The method comprises steps E1 to E5.

Step E1 is the sending of a measurement control from the control module 26 to the temperature sensors 21 to 24, by radio. Alternatively, the measurement control is selective and controls only the selected sensor(s). The measurement control is, for example, periodic. The period may be 1 minute.

It is noted that the energy needed for the sensors 21 to 24 to operate is transmitted from the control module 26 by radio. The sending of energy may or may not be associated with the sending of the measurement control.

In the next step E2, the temperature sensors 21 to 24 receive the measurement control and measure the temperature of the point where they are respectively placed. A signal representative of the temperature measurement is formed and the next step E3 is the transmission of the representative signal by the temperature sensors via antenna 25 to the control module 26. The quantities measured are thus sent by radio to the control module 26.

In the next step E4, the module 26 receives the signal transmitted via antenna 27. The module 26 processes the measurement data in order to determine whether or not the temperatures measured in the high-voltage portion of the disconnector are normal. This determination is, for example, performed by comparing measured temperatures with nominal temperatures.

It is possible to define and monitor overload parameters of the disconnector. For example, at each measurement time, and for each measurement point, it is possible to determine the difference ΔT between the measured temperature and a limit temperature.

It is also possible to take into account the time constant τ of the disconnector. Thus, the maximum current $I_{max}$ that may be tolerated by the disconnector is given by the formula:

$$I_{max}=K \cdot e^{-t/\tau}$$

where K is a constant.

This formula makes it possible to verify the time constant τ in order either to correct the formula above if there are slight variations in the time constant, or to generate an alert if the time constant varies significantly.

In the next step E5, the module 26 produces a message intended for supervision of the disconnector. The message is dependent upon the result of the processing performed by the module 26 on the measured temperatures. The message is transmitted to a human-machine interface.

The process according to the invention is implemented by a dedicated integrated circuit or by programmable processors, or in the form of a computer program stored in the memory of a computer.

Figure 3:
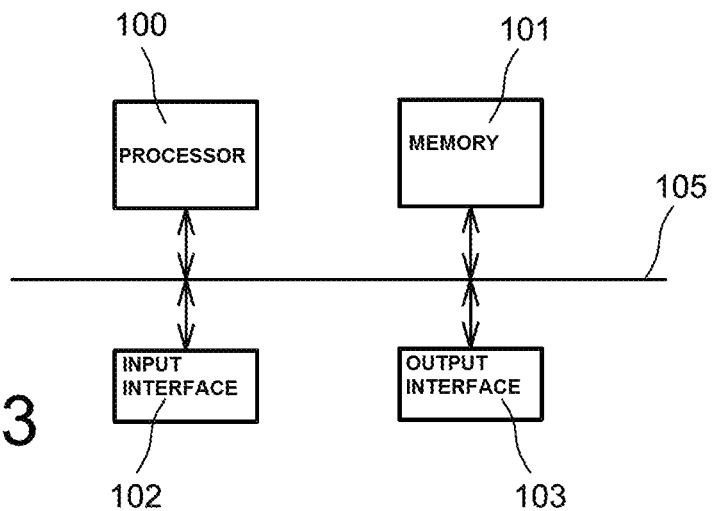
FIG. 3 shows a control module of a temperature measurement device in a switchgear station, according to an embodiment of the present invention.

Thus, FIG. 3 shows a particular embodiment of the control module 26 according to the invention.

This module has the general structure of a computer. It comprises in particular a processor 100 running a computer program implementing the method according to the invention, a memory 101, an input interface 102 and an output interface 103.

These different elements are classically connected by a bus.

The input interface 102 is connected to the antenna 27 and is intended to receive the data to be processed.

The processor 100 performs the processing operations described above. These processing operations are performed in the form of computer program code instructions that are stored by the memory 101 before being executed by processor 100.

The memory 101 may also store the results of the processing operations performed.

The output interface 103 provides the measured temperature processing results.

What is claimed is:

1. A disconnector in a high-voltage switchgear station of the Air Insulated Substation type, comprising:
    a high-voltage portion comprising contacts;
    a low-voltage portion, separated from the high-voltage portion;
    a plurality of temperature sensors located in the high-voltage portion near hot spots of the disconnector, on the contacts and being suitable to measure a temperature of the hot spot where each of the plurality of temperature sensors is located, wherein at least one of the plurality of temperature sensors is near a terminal, at least one of the plurality of temperature sensors is near a main cutter, and at least one of the plurality of temperature sensors is near a contact;
    at least one temperature sensor antenna connected to at least one of the plurality of temperature sensors, wherein a wire connects each of the plurality of temperature sensors to the at least one temperature sensor antenna;
    a control module located in the low-voltage portion of the switchgear station; and
    at least one control module antenna connected to the control module, wherein the at least one control module antenna transmits electromagnetic energy to power the at least one temperature sensor via the at least one temperature sensor antenna, the at least one temperature sensor being suitable for transmitting a signal representative of the temperature measurement and the control module being suitable for receiving the representative signal, via the antennas, and processing the representative signal to generate a message,
    wherein the disconnector is configured for use in a high-voltage switchgear station of the Air Insulated Substation type.

2. The disconnector according to claim 1, wherein the plurality of temperature sensors are passive sensors.

3. The disconnector according to claim 1, wherein the plurality of temperature sensors are powered by the control module via the antennas.

4. The disconnector according to claim 1, wherein the control module is suitable to take into account a time constant τ of the disconnector.

5. A temperature measurement method in a disconnector in a high-voltage switchgear station of the Air Insulated Substation type, the disconnector comprising a high-voltage portion comprising contacts and a low-voltage portion separated from the high-voltage portion, the method comprising:
    temperature measurement by a plurality of temperature sensors located on the contacts of the disconnector, wherein at least one of the plurality of temperature sensors measures temperature of a terminal, at least one of the plurality of temperature sensors measures temperature of a main cutter, and at least one of the plurality of temperature sensors measures temperature of a contact,
    transmission of electromagnetic energy by a control module via a control module antenna to at least one temperature sensor antenna of at least one of the plurality of temperature sensors,
    transmission of a signal representative of the temperature measurement by the at least one temperature sensor antenna,
    reception of the representative signal by the control module located in the low-voltage portion of the switchgear station, via the at least one control module antenna, and
    processing of the representative signal by the control module to generate a message,
    wherein the disconnector is configured for use in a high-voltage switchgear station of the Air Insulated Substation type.

6. A non-transitory computer readable recording medium on which a computer program is recorded, including instructions for carrying out the method according to claim 5.

* * * * *